(12) United States Patent
Katano et al.

(10) Patent No.: US 6,756,178 B2
(45) Date of Patent: Jun. 29, 2004

(54) POSITIVE PHOTORESIST COMPOSITION AND METHOD OF PATTERNING RESIST THIN FILM FOR USE IN INCLINED IMPLANTATION PROCESS

(75) Inventors: Akira Katano, Kanagawa (JP); Yusuke Nakagawa, Kanagawa (JP); Shinichi Kono, Kanagawa (JP); Kousuke Doi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/294,571

(22) Filed: Nov. 15, 2002

(65) Prior Publication Data

US 2003/0134223 A1 Jul. 17, 2003

(30) Foreign Application Priority Data

Nov. 16, 2001 (JP) ........................................ 2001-352287

(51) Int. Cl.⁷ ............................. G03F 7/023; G03F 7/30
(52) U.S. Cl. ....................... 430/191; 430/192; 430/193; 430/326; 430/330
(58) Field of Search ................................. 430/191, 192, 430/193, 326, 330, 165

(56) References Cited

U.S. PATENT DOCUMENTS 5,403,695 A    4/1995  Hayase et al.
5,580,702 A    12/1996 Hayase et al.
6,475,694 B2 * 11/2002 Doi et al. ................... 430/191

FOREIGN PATENT DOCUMENTS

| JP | 03-249654 A | 11/1991 |
| JP | 05-127386 A | 5/1993 |
| JP | 06-130665 A | 5/1994 |
| JP | 06-202320 A | 7/1994 |
| JP | 07-005682 A | 1/1995 |
| JP | 09-179300 A | 7/1997 |

\* cited by examiner

*Primary Examiner*—John S. Chu
(74) *Attorney, Agent, or Firm*—Sughrue Mion, PLLC

(57) ABSTRACT

A composition includes (A) a novolak resin containing at least 20% by mole of a m-cresol repeating unit and having a 1-ethoxyethyl group substituting for part of hydrogen atoms of phenolic hydroxyl groups, (B) a quinonediazide ester of, for example, the following formula, and (C) 1,1-bis(4-hydroxyphenyl)cyclohexane.

(I)

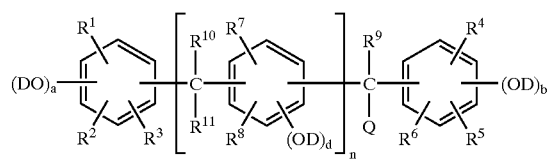

7 Claims, No Drawings

POSITIVE PHOTORESIST COMPOSITION AND METHOD OF PATTERNING RESIST THIN FILM FOR USE IN INCLINED IMPLANTATION PROCESS

BACKGROUND OF THE INVENTION

1. Field of the Invention

The present invention relates to a positive photoresist composition and a method of patterning a resist thin film for use in an inclined implantation process. More specifically, it relates to a highly sensitive positive photoresist composition that is used in photolithography using i-line (365 nm) and specifically advantageously in an inclined implantation process using a very thin resist film about 0.1 to 0.5 μm thick, as well as to a method of patterning a resist thin film for use in the inclined implantation process using the positive photoresist composition.

2. Description of the Related Art

Photoresist compositions each containing an alkali-soluble resin and a quinonediazido-group-containing compound have satisfactory definition, sensitivity, etching resistance and thermal resistance in a photolithography process using i-line (365 nm) and therefore have been applied to practical use in fabrication of semiconductor devices and liquid crystal devices.

Such resist patterns having a size smaller than the wavelength of exposing light have been believed to be hardly formed by photolithography without deteriorating the above properties. However, fine resist patterns of about 0.35 μm, smaller than the wavelength of i-line, can now be formed as a result of improvements in materials, process conditions and exposure techniques.

With increasing diameters of silicon substrates for semiconductors and glass substrates for liquid crystal display devices, increasing demands have been made on positive photoresist compositions with higher sensitivity to improve throughputs. Improvements in conventional positive photoresist compositions each containing an alkali-soluble resin and a quinonediazido-group-containing compound have therefore been proposed.

For example, Japanese Patent Laid-Open No. 3-249654 discloses a photosensitive composition containing a polymeric compound (e.g., a novolak resin) having an acid-decomposable substituent, and a 1,2-naphthoquinonediazido-4-sulfonic acid ester.

However, the photosensitive composition often invites insoluble matters to form during storage and must have higher definition and sensitivity. In addition, the photosensitive composition is readily deactivated upon contact with a basic substance in the air to vary its sensitivity and is thereby insufficient in post-coating delay (PCD; time interval between coating process and exposure process) stability and post-exposure delay (PED; time interval between exposure process to post-exposure baking (PEB) process) stability. In short, the resist composition is insufficient in "stability of latent image before development."

Japanese Patent Laid-Open No. 5-127386 discloses a photosensitive composition containing a polymer and a photosensitive acid generator (e.g., an orthoquinonediazidosulfonic acid ester), which polymer comprises a hydrogenated alkali-soluble resin (e.g., a novolak resin) having a phenol skeleton and having dissolution inhibiting groups being unstable to acids and being combined with its phenolic hydroxyl groups.

However, the photosensitive composition must be exposed to excimer laser light and thus invites high production cost.

Japanese Patent Laid-Open No. 5-181279 discloses a photosensitive composition containing a polyhydroxystyrene polymer having an acid-decomposable substituent, and a photosensitive acid generator (e.g., an orthoquinonediazidosulfonic acid ester).

The photosensitive composition, however, often invites insoluble matters to form during storage and must have higher sensitivity and definition.

Japanese Patent Laid-Open No. 6-130665 discloses a photosensitive composition containing an alkali-soluble resin (e.g., a novolak resin) having an acid-decomposable substituent, and a photosensitive acid generator (e.g., a quinonediazide compound).

The photosensitive composition, however, must be exposed to excimer laser light and thus invites high production cost.

Japanese Patent Laid-Open No. 6-202320 discloses a photosensitive composition containing an alkali-soluble resin (e.g., a novolak resin) having an acid-decomposable substituent, and a 1,2-naphthoquinonediazido-4-sulfonic acid ester of a polyhydroxybenzophenone.

The photosensitive composition, however, often invites insoluble matters to form during storage and must have higher sensitivity and definition.

Japanese Patent Laid-Open No. 7-5682 discloses a resist composition containing a polyhydroxystyrene polymer having an acid-decomposable substituent, and a 1,2-naphthoquinonediazide compound.

However, the resist composition must be exposed to excimer laser light and thus invites high production cost.

Japanese Patent Laid-Open No. 9-179300 discloses a resist composition containing a polyhydroxystyrene polymer having an acid-decomposable substituent, a photosensitive acid generator (e.g., a quinonediazide compound), and an acid-diffusion controlling agent.

However, the resist composition must be exposed to excimer laser light and thus invites high production cost.

In addition, all the aforementioned compositions must be improved in their stability of latent image before development.

Separately, an "inclined implantation" process is proposed in, for example, Japanese Patent Laid-Open No. 8-22965. In this process, an inclined semiconductor substrate having a patterned resist mask is subjected to ion implantation to thereby selectively implant dopant ions to a surface of the semiconductor substrate.

The process is believed to be effective for selective ion implantation into a small area of the substrate directly below the patterned resist or into side walls of holes disposed on the substrate.

When an ultrafine resist pattern of about 0.35 μm is formed by the inclined implantation process, a patterned resist film serving as a mask must be very thin of about 0.1 to 0.5 μm so as not to inhibit ion implantation.

However, when very thin resist films are formed using conventional positive photoresist compositions, the resulting very thin resist films cannot yield satisfactory latent images, are reduced in thickness in unexposed portions, invite large amounts of scum, or cannot yield patterned resists having a good shape.

In addition, the patterned resist films are exposed to elevated temperatures during implantation process and must have high thermal resistance. Accordingly, the resist films are subjected to "post-baking" heat treatment after development. The positive photoresist compositions for use in the implantation process must have sufficient thermal resistance to resist deformation of patterned resist films during post-baking.

Positive photoresist compositions for use in the inclined implantation process using a patterned resist thin film about 0.1 to 0.5 μm thick must yield a patterned resist film with high definition and contrast and satisfactory shape, must have high sensitivity, invite less scum and have satisfactory stability of latent image before development and high thermal resistance.

SUMMARY OF THE INVENTION

Accordingly, an object of the present invention is to provide a positive photoresist composition that has highly improved sensitivity and definition, can yield a patterned resist thin film with high contrast, invites less scum and has satisfactory stability of latent image before development and thermal resistance specifically in an inclined implantation process.

Another object of the present invention is to provide a method of patterning a resist thin film for use in an inclined implantation process using the positive photoresist composition.

After intensive investigations, the present inventors have solved the problems of the conventional technologies.

Specifically, the present invention provides, in an aspect, a positive photoresist composition including:

(A) a novolak resin containing equal to or more than 20% by mole of a m-cresol constitutional repeating unit in total phenolic constitutional repeating units and having 1-ethoxyethyl groups substituting for part of hydrogen atoms of phenolic hydroxyl groups;

(B) a quinonediazide ester represented by following Formula (I):

Formula (I):

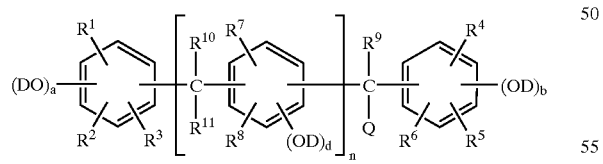

wherein each of $R^1$, $R^2$, $R^3$, $R^4$, $R^5$, $R^6$, $R^7$, and $R^8$ is independently a hydrogen atom, a halogen atom, an alkyl group containing 1 to 6 carbon atoms, an alkoxy group containing 1 to 6 carbon atoms, or a cycloalkyl group;

each of $R^9$, $R^{10}$, and $R^{11}$ is independently a hydrogen atom or an alkyl group containing 1 to 6 carbon atoms;

Q is a hydrogen atom or an alkyl group containing 1 to 6 carbon atoms, or Q is combined with $R^9$ to form a cycloalkyl group containing 3 to 6 carbon members or a residue represented by following Formula (II):

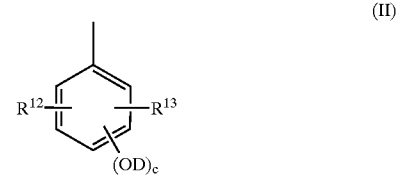

wherein each of $R^{12}$ and $R^{13}$ is independently a hydrogen atom, a halogen atom, an alkyl group containing 1 to 6 carbon atoms, an alkoxy group containing 1 to 6 carbon atoms, or a cycloalkyl group; and c is an integer of from 1 to 3;

each of Ds is independently a hydrogen atom or a 1,2-naphthoquinonediazido-5-sulfonyl group, where at least one of Ds is a 1,2-naphthoquinonediazido-5-sulfonyl group;

each of a and b is independently an integer of from 1 to 3;

d is an integer of from 0 to 3; and n is an integer of from 0 to 3; and (C) a phenolic compound represented by following Formula (III):

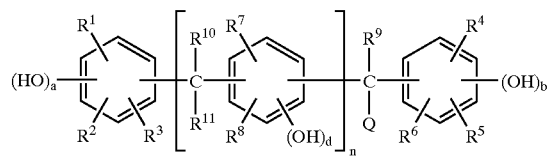

wherein each of $R^1$, $R^2$, $R^3$, $R^4$, $R^5$, $R^6$, $R^7$, and $R^8$ is independently a hydrogen atom, a halogen atom, an alkyl group containing 1 to 6 carbon atoms, an alkoxy group containing 1 to 6 carbon atoms, or a cycloalkyl group;

each of $R^9$, $R^{10}$, and $R^{11}$ is independently a hydrogen atom or an alkyl group containing 1 to 6 carbon atoms;

Q is a hydrogen atom or an alkyl group containing 1 to 6 carbon atoms, or Q is combined with $R^9$ to form a cycloalkyl group containing 3 to 6 carbon members or a residue represented by following Formula (IV):

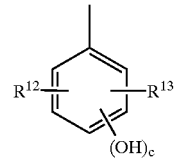

wherein each of $R^{12}$ and $R^{13}$ is independently a hydrogen atom, a halogen atom, an alkyl group containing 1 to 6 carbon atoms, an alkoxy group containing 1 to 6 carbon atoms, or a cycloalkyl group; and c is an integer of from 1 to 3;

each of a and b is independently an integer of from 1 to 3;

d is an integer of from 0 to 3; and n is an integer of from 0 to 3.

The positive photoresist composition may further include (D) at least one compound capable of absorbing light with a wavelength of approximately 365 nm.

Preferably, the positive photoresist composition further includes (E) at least one amine.

The positive photoresist composition may further include (F) at least one organic carboxylic acid.

Preferably, the 1-ethoxyethyl group substitutes for 30% to 70% by mole of hydrogen atoms of phenolic hydroxyl groups in the novolak resin (A).

A resist film prepared from the positive photoresist composition preferably has a B parameter of from 0.2 to 1.0.

The positive photoresist composition of the present invention has highly improved sensitivity and definition, can yield a patterned resist thin film with high contrast, invites less scum, has satisfactory thermal resistance and stability of latent image before development and thereby can be advantageously used in an inclined implantation process.

The present invention provides, in another aspect, a method of patterning a resist thin film for use in an inclined implantation process. The method includes the steps of:

(1) applying a solution of the positive photoresist composition to a substrate and drying the applied solution to thereby form a resist film having a thickness of from 0.1 to 0.5 μm;

(2) selectively exposing the resist film through a mask;

(3) subjecting the exposed resist film to post-exposure baking;

(4) developing the resulting resist film with an aqueous alkaline solution to thereby dissolve and remove exposed portions of the resist film; and (5) post-baking the resulting film.

By using the positive photoresist composition of the present invention, the method can pattern a resist thin film that can be advantageously used in an inclined implantation process.

DETAILED DESCRIPTION OF THE INVENTION

Novolak Resins (A)

Novolak resins for use as the ingredient (A) in positive photoresist compositions of the present invention can be novolak resins each having equal to or more than 20% by mole of a m-cresol constitutional repeating unit in total phenolic constitutional repeating units and having a 1-ethoxyethyl group substituting part of hydrogen atoms of phenolic hydroxyl groups.

The term "m-cresol constitutional repeating unit" used herein means and includes constitutional repeating units derived from m-cresol used as a phenol in the preparation of the novolak resins (A) and is for example represented by the following formulae.

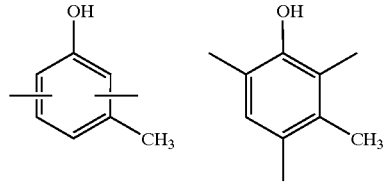

The term "phenolic constitutional repeating units" means and includes constitutional repeating units derived from phenols used in the preparation of the novolak resins (A).

The novolak resins (A) can be prepared by any process. For example, they can be prepared by preparing an unprotected novolak resin in the following manner and replacing part of hydrogen atoms of its phenolic hydroxyl groups with 1-ethoxyethyl group. Such unprotected novolak resins can be prepared by dissolving phenols containing equal to or more than 20% by mole of a m-cresol constitutional repeating unit, an aldehyde or ketone in an organic solvent, and subjecting the components to polycondensation in the presence of an acidic catalyst.

The content of the m-cresol constitutional repeating units in the total phenolic constitutional repeating units of the ingredient (A) is preferably equal to or more than 20% by mole, more preferably equal to or more than 60% by mole, and most preferably 100% by mole, i.e., the m-cresol constitutional repeating units occupy 100% of the total phenolic constitutional repeating units. If the content of the m-cresol constitutional repeating units is less than 20% by mole, the resulting positive photoresist composition may fail to have well-balanced molecular weight, molecular weight distribution and dissolving rate in alkaline solutions and may fail to yield a patterned resist film with a good shape.

Phenols that can be used in the preparation of the ingredient (A) in addition to m-cresol include, but are not limited to, phenol; p-cresol, o-cresol; 2,3-xylenol, 2,5-xylenol, 3,5-xylenol, 3,4-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these phenols can be used alone or in combination.

Aldehydes for use in the preparation of the ingredient (A) include, but are not limited to, formaldehyde, paraformaldehyde, trioxane, acetaldehyde, propionaldehyde, butyraldehyde, trimethylacetaldehyde, acrolein (acrylaldehyde), crotonaldehyde, cyclohexanecarbaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Among these aldehydes, formaldehyde is preferred for its high availability. To improve thermal resistance of the positive photoresist composition, a combination use of a hydroxybenzaldehyde and formaldehyde is typically preferred.

Ketones for use in the preparation of the ingredient (A) include, but are not limited to, acetone, methyl ethyl ketone, diethyl ketone, and diphenyl ketone. Each of these ketones can be used alone or in combination. An appropriate combination use of an aldehyde with a ketone is also acceptable.

The amount of the aldehyde(s) and/or ketone(s) is preferably from about 40% to about 85% by weight relative to the phenols.

Acidic catalysts for use in the preparation of the ingredient (A) include, but are not limited to, hydrochloric acid, sulfuric acid, formic acid, oxalic acid, and p-toluenesulfonic acid. The amount of the acidic catalyst is preferably from about 0.05% to about 5% by weight relative to the phenols.

Organic solvents for use in the preparation of the ingredient (A) include, but are not limited to, methanol, ethanol, propanol, butanol, ethylene glycol, propylene glycol, and other alcohols; diethylene glycol dimethyl ether, propylene glycol monopropyl ether, 1,2-dimethoxyethane, 1,2-diethoxyethane, and other ethers; tetrahydrofuran, 1,4-dioxane, and other cyclic ethers; acetone, methyl ethyl ketone, methyl isobutyl ketone, methyl amyl ketone, and other ketones; γ-butyrolactone and other cyclic esters. The amount of the organic solvent(s) is preferably from about 100% to about 200% by weight relative to the phenols for satisfactory cost and reaction rate.

The novolak resins prepared above are novolak resins before substitution of part of hydrogen atoms of phenolic hydroxyl groups with 1-ethoxyethyl groups (hereinafter briefly referred to as "unprotected novolak resin(s)"). The unprotected novolak resins have a weight average molecular weight (Mw) in terms of polystyrene of preferably from about 1500 to about 10000, and more preferably from about 2000 to about 5000.

Preferably, low molecular weight fractions of the unprotected novolak resins are removed by, for example, fractionation. Techniques for the removal are not specifically limited, but such low molecular weight fractions are preferably removed in the following manner. A solution of the alkali-soluble resin is dissolved in methyl amyl ketone (MAK), and the resulting solution is washed with water to remove a catalyst and unreacted materials. To the residual is added a poor solvent such as hexane or heptane, or a hexane-MAK or heptane-MAK mixture, and the resultant mixture is stirred and then allowed to stand to separate a poor solvent layer containing high molecular weight fractions as a lower layer, and an MAK layer containing low molecular weight fractions as an upper layer. The lower layer is extracted and thereby yields an unprotected novolak resin having a higher molecular weight.

If the weight average molecular weight Mw of the unprotected novolak resin is less than about 1500, the resulting composition may not be applied in a satisfactory manner. In contrast, if it exceeds about 10000, the resulting composition may have deteriorated definition. The molecular weight distribution [(weight average molecular weight)/(number average molecular weight)=Mw/Mn] of the unprotected novolak resin is preferably less than or equal to 6 and more preferably less than or equal to 4 to yield a patterned resist film having a good shape.

In addition, the unprotected novolak resin preferably has higher solubility in an alkaline aqueous solution (a developer solution). A resist film 1 µm thick prepared from the unprotected novolak resin completely dissolves in 2.38% by weight tetramethylammonium hydroxide (TMAH) aqueous solution at 23° C. preferably within ten seconds and more preferably within five seconds. In the above procedure, the resist film is prepared by dissolving the unprotected novolak resin in an appropriate solvent such as 2-heptanone, applying the solution to a substrate to yield a film, and drying the film at 110° C. for 90 seconds.

By using such an unprotected novolak resin having very high solubility in an alkaline aqueous solution (developer solution), the resulting positive photoresist composition has satisfactory thermal resistance and stability of latent image before development, has highly improved sensitivity and definition and can yield a patterned resist thin film with high contrast that is suitable for use in the inclined implantation process.

The novolak resin (A) for use in the positive photoresist compositions of the present invention can be prepared by substituting or replacing part of hydrogen atoms of phenolic hydroxyl groups in the unprotected novolak resins with a 1-ethoxyethyl group. By using the novolak resin (A) having the 1-ethoxyethyl group, unexposed portions of the resulting resist film have increased insolubility and, in contrast, exposed portions thereof have increased solubility in an alkaline aqueous solution (developer solution) to thereby yield a patterned resist film with high contrast.

The process for substituting part of hydrogen atoms of phenolic hydroxyl groups of the unprotected novolak resin with a 1-ethoxyethyl group is not specifically limited and includes the following process. Initially, the unprotected novolak resin is dissolved in an organic solvent, the resulting solution is treated with an acid and a compound corresponding to 1-ethoxyethyl group, such as 1-ethoxyethene, at a temperature from about 20° C. to about 70° C. for about 1 to about 10 hours. The reaction mixture is then neutralized with a basic substance (basic catalyst), is treated with, for example, an ion exchange resin to remove the basic catalyst, salts and other unnecessary components in the reaction mixture, is concentrated using an evaporator to remove the organic solvent under reduced pressure and thereby yields the novolak resin as the ingredient (A) having 1-ethoxyethyl groups substituting for part of hydrogen atoms of phenolic hydroxyl groups.

Such organic solvents for use herein are not specifically limited, as long as they can dissolve the ingredient (A), and can be chosen from those used in the preparation of the unprotected novolak resins. Preferred organic solvents are those that are not miscible with an acid aqueous solution or water used in a washing process after the reaction, of which 1,4-dioxane is typically preferred.

The basic catalyst includes, but is not limited to, ethylamine, ethanolamine, diethylamine, diisopropylamine, diethanolamine, dicyclohexylamine, and other primary and secondary amines; trimethylamine, triethylamine, tripropylamine, and other tertiary amines each containing a lower alkyl group, of which triethylamine is preferred.

The acid includes, for example, p-toluenesulfonic acid.

The 1-ethoxyethyl group is an acid-decomposable group that can be decomposed by action of an acid. Such acid-decomposable groups further include methoxymethyl group, 1-methoxyethyl group, tert-butyl group, trimethylsilyl group, and tert-butoxycarbonyl (t-BOC) group. Among these acid-decomposable groups, 1-ethoxyethyl group can be most efficiently decomposed by action of an acid derived from the quinonediazide ester (B) used in the present invention.

In the ingredient (A), the 1-ethoxyethyl group substitutes for preferably about 30% to about 70% by mole, and more preferably about 40% to about 60% by mole of hydrogen atoms of phenolic hydroxyl groups. If this rate is less than 30% by mole, the positive photoresist composition may have insufficient contrast in development and may invite increased scum. In contrast, if it exceeds 70% by mole, the positive photoresist composition may have deteriorated sensitivity and definition, may fail to yield finely patterned resist films, or may yield patterned resist films with a T-top profile.

The novolak resin (A) having 1-ethoxyethyl group preferably has lower solubility in an alkaline aqueous solution to yield patterned resist films with high contrast. For example, it preferably takes for a resist film 1 µm thick prepared from the novolak resin (A) to completely dissolve in 5.0% by weight tetramethylammonium hydroxide (TMAH) aqueous solution equal to or more than 300 seconds. In this procedure, the resist film is prepared by dissolving the novolak resin (A) in an appropriate solvent, such as 2-heptanone, to yield a solution, applying the solution to a substrate to yield a film, and drying the film at 110° C. for 90 seconds.

An example is shown below in which a 1-ethoxyethyl group substitutes for a hydrogen atom of a phenolic hydroxyl group.

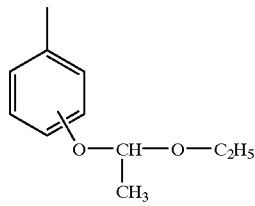

Quinonediazide Esters (B)

Quinonediazide esters for use as the ingredient (B) in the positive photoresist compositions of the present invention can be quinonediazide esters each having at least one 1,2-naphthoquinonediazido-5-sulfonyl group in its molecule and represented by Formula (I).

The quinonediazide esters (B) can be prepared by subjecting a compound of Formula (I), wherein all Ds are hydrogen atoms, to condensation with a 1,2-naphthoquinonediazido-5-sulfonyl halide and esterifying the condensation product partially or completely. The condensation is advantageously performed in an organic solvent such as dioxane, N-methylpyrrolidone and dimethylacetamide in the presence of a basic condensing agent such as triethylamine, alkali metal carbonates and alkali metal hydrogencarbonates. In this procedure, preferably equal to or more than 50% by mole, and more preferably equal to or more than 60% by mole of total hydroxyl groups in the phenolic compound is esterified with the 1,2-naphthoquinonediazido-5-sulfonyl halide. In other words, the quinonediazide esters (B) for use herein preferably have an esterification percentage of equal to or more than 50% and more preferably equal to or more than 60%. Such quinonediazide esters can have higher definition.

By using the ingredient (B), the positive photoresist compositions of the present invention have satisfactory sensitivity and definition and can achieve definition of 0.35 µm or below in photolithography using i-line.

Preferred examples of the quinonediazide esters (B) represented by Formula (I) are quinonediazide esters of:

2,4-bis(3,5-dimethyl-4-hydroxybenzyl)-5-hydroxyphenol, 2,6-bis(2,5-dimethyl-4-hydroxybenzyl)-4-methylphenol, and other linear trinuclear compounds;

bis[2,5-dimethyl-3-(2-hydroxy-5-methylbenzyl)-4-hydroxyphenyl]methane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and other linear tetranuclear compounds;

2,6-bis[2,5-dimethyl-3-(2-hydroxy-5-methylbenzyl)-4-hydroxybenzyl]-4-methylphenol, 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and other linear pentanuclear compounds; and other linear polyphenolic compounds;

tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane, and other trisphenol polyphenolic compounds; and 1-[1,1-bis(4-hydroxyphenyl)ethyl]-4-[1-(4-hydroxyphenyl)isopropyl]benzene.

Among the quinonediazide esters (B) represented by Formula (I), typically preferred compounds for high definition of 0.35 µm or below are linear esters represented by the following formula:

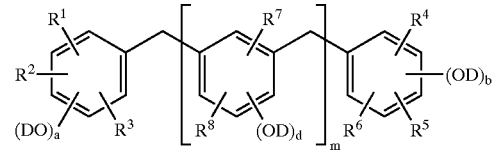

wherein $R^1$ to $R^8$, D, a, b and d have the same meanings as defined above; and m is an integer of from 1 to 3, and branched esters represented by the following formula:

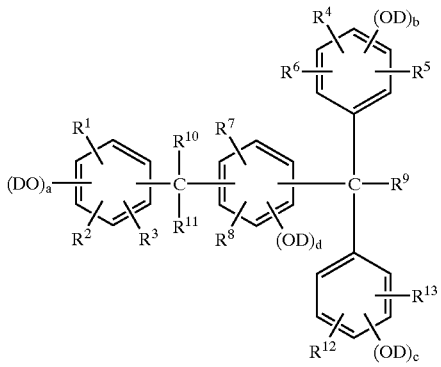

wherein $R^1$ to $R^{13}$, D, a, b, c and d have the same meanings as defined above.

The ingredient (B) for use in the positive photoresist compositions of the present invention must have at least one 1,2-naphthoquinonediazido-5-sulfonyl group in the molecule. By action of the 1,2-naphthoquinonediazido-5-sulfonyl group, 1-ethoxyethyl group as an acid-decomposable group in the ingredient (A) can be efficiently decomposed. In addition, by using the ingredient (B), the positive photoresist compositions of the present invention can have satisfactory storage stability, yield less foreign matters formed with time and thereby invite less scum.

The amount of the ingredient (B) can be selected within the range of from about 5% to about 80% by weight, and preferably from about 10% to about 70% by weight, relative to the total weight of the ingredients (A) and (C). If the amount is less than 5% by weight, the resulting photosensitive composition may fail to form images in exact accordance with the pattern and may have deteriorated transfer property. In contrast, if it exceeds 80% by weight, the positive photoresist composition may have decreased sensitivity and may fail to yield uniform resist films with high definition.

Phenolic Compounds (C)

The ingredient (C) for use in the positive photoresist composition of the present invention includes phenolic compounds represented by Formula (III).

By using the ingredient (C), the positive photoresist compositions of the present invention yield less scum, exhibit improved definition and can thereby yield a patterned resist film with a good shape in the ultrafine patterning of resist films of 0.35 μm or below.

Preferred examples of the phenolic compounds (C) represented by Formula (III) include bis(4-hydroxy-2,3,5-trimethylphenyl)-2-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1,4-bis[1-(3,5-dimethyl-4-hydroxyphenyl)isopropyl]benzene, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,4-bis(3,5-dimethyl-4-hydroxyphenylmethyl)-6-methylphenol, 2,6-bis(2,5-dimethyl-4-hydroxyphenylmethyl)-4-methylphenol, 2,6-bis(3-methyl-4,6-dihydroxyphenylmethyl)-4-methylphenol, 2,6-bis(2,3,4-trihydroxyphenylmethyl)-4-methylphenol, 2,6-bis(2,5-dimethyl-4-hydroxybenzyl)-4-methylphenol, and 1,1-bis(4-hydroxyphenyl)cyclohexane.

Among them, typically preferred are 2,6-bis(2,5-dimethyl-4-hydroxybenzyl)-4-methylphenol and 1,1-bis(4-hydroxyphenyl)cyclohexane for satisfactory definition and rectangular profile of the resulting resist films.

The amount of the ingredient (C) can be selected within the range of from about 5% to about 50% by weight, and preferably from about 10% to about 40% by weight relative to the weight of the ingredient (A). If the amount is less than 5% by weight, the positive photoresist composition may have deteriorated sensitivity. If it exceeds 50% by weight, the positive photoresist composition may invite increased scum.

Ingredients (D)

The positive photoresist compositions of the present invention may further comprise (D) at least one compound that is capable of absorbing light with a wavelength of approximately 365 nm. By using the ingredient (D), the positive photoresist compositions of the present invention can yield patterned resists having further satisfactory shapes.

In the inclined implantation process using a patterned resist thin film about 0.1 to 0.5 μm thick, the patterned resist thin film may frequently have a deteriorated shape due to reflected light from the substrate. The ingredient (D) is preferably used in the process to mitigate such adverse effects of the reflected light from the substrate.

Such ingredients (D) for use in the present invention are not specifically limited, as long as they are miscible with the positive photoresist compositions and include, for example, 2,2,4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, and curcumin. Among them, 2,2,4,4'-tetrahydroxybenzophenone is preferred for its low cost and high halation-preventing capability.

The amount of the ingredient (D) is preferably controlled so that a resist film formed on a substrate using the positive photoresist composition of the present invention has a B parameter of from about 0.2 to about 1.0 and more preferably from about 0.3 to about 0.7. The B parameter represents the absorptivity of the resist film with respect to light irradiated after exposure of the resist film on the substrate.

The B parameter can be determined in the following manner. Initially, a sample resist composition is applied to a quartz substrate, is dried (prebaked) and thereby yields a resist film 1.0 μm thick. Next, i-line (365 nm) is applied to the resist film and the transmittance of the resist film is determined using an optical parameter measuring system (available from Litho Tech Japan Corporation under the trade name of ABC Analyzer Model 300), and the B parameter is determined by calculation according to the following equation:

$$B = (-1/d) \times \ln T^\infty$$

wherein d is the thickness of the resist film; and $T^\infty$ is (transmittance after ultraviolet irradiation)/100.

While depending on its type, the amount of the ingredient (D), if any, is preferably selected within the range of from about 0.1% to about 5% by weight, and more preferably from about 1% to about 3% by weight, relative to the total weight of the ingredients (A), (B) and (C). If the amount is less than 0.1% by weight, halation from the substrate may not be prevented sufficiently, and if it exceeds 5% by weight, the resulting composition may invite scum formation.

Amines (E)

The positive photoresist compositions of the present invention may further comprise (E) at least one amine to further improve stability of latent image before development.

Such amines (E) are not specifically limited, as long as they are miscible with the positive photoresist compositions, and include, for example, aliphatic amines, aromatic amines, and heterocyclic amines.

The aliphatic amines include, but are not limited to, methylamine, dimethylamine, trimethylamine, ethylamine, diethylamine, triethylamine, n-propylamine, di-n-propylamine, tri-n-propylamine, and isopropylamine. The aromatic amines include, but are not limited to, benzylamine, aniline, N-methylaniline, N,N-dimethylaniline, o-methylaniline, m-methylaniline, p-methylaniline, N,N-diethylaniline, diphenylamine, and di-p-tolylamine. The heterocyclic amines include, but are not limited to, pyridine, o-methylpyridine, o-ethylpyridine, 2,3-dimethylpyridine, 4-ethyl-2-methylpyridine, and 3-ethyl-4-methylpyridine.

Each of these amines can be used alone or in combination as the ingredient (E). Among them, the single use of triethylamine is preferred for further satisfactory patterned resist shape and stability of latent image before development.

The amount of the ingredient (E), if any, is preferably from about 0.01% to about 2% by weight, and more preferably from about 0.1% to about 1% by weight, relative to the total weight of the ingredients (A), (B), (C) and (D). If the amount is less than 0.01% by weight, the positive photoresist composition may vary in its sensitivity during post-exposure delay (PED). In contrast, if it exceeds 2% by weight, exposure sensitivity may deteriorate.

Organic Carboxylic Acids (F)

The positive photoresist compositions of the present invention may further comprise (F) at least one organic carboxylic acid for better shapes of patterned resist films.

Such organic carboxylic acids (F) are not specifically limited, as long as they are miscible with the positive photoresist compositions, and include, for example, saturated or unsaturated aliphatic carboxylic acids, alicyclic carboxylic acids, hydroxycarboxylic acids, alkoxycarboxylic acids, ketocarboxylic acids, and aromatic carboxylic acids.

The saturated aliphatic carboxylic acids include, but are not limited to, formic acid, acetic acid, propionic acid, butyric acid, isobutyric acid, oxalic acid, malonic acid, succinic acid, glutaric acid, adipic acid, and other mono- or poly-carboxylic acids. The unsaturated aliphatic carboxylic acids include, but are not limited to, acrylic acid, crotonic acid, isocrotonic acid, 3-butenoic acid, methacrylic acid, 4-pentenoic acid, 2-butynoic acid, maleic acid, fumaric acid, and acetylenecarboxylic acid. The alicyclic carboxylic acids include, but are not limited to, 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexyldiacetic acid. The hydroxycarboxylic acids include, for example, hydroxyacetic acid. The alkoxycarboxylic acids include, for example, methoxyacetic acid and ethoxyacetic acid. The ketocarboxylic acids include, for example, pyruvic acid. Examples of the aromatic carboxylic acids are p-hydroxybenzoic acid, o-hydroxybenzoic acid (salicylic acid), 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid, isophthalic acid, and other aromatic carboxylic acids each having a substituent such as nitro group, carboxyl group and vinyl group.

Among these organic carboxylic acids, aromatic carboxylic acids are preferred since they have appropriate acidity and are nonvolatile, of which salicylic acid is typically preferred since it is highly soluble in the positive photoresist compositions and can yield satisfactory patterned resist films on different types of substrates.

The amount of the ingredient (F) is, if any, from about 0.01% to about 2% by weight, and preferably from about 0.1% to about 1% by weight, relative to the total weight of the ingredients (A), (B), (C) and (D). If the amount is less than 0.01% by weight, the positive photoresist composition may vary in its sensitivity during post-exposure delay (PED). In contrast, if it exceds 2% by weight, exposure sensitivity may deteriorate Additives The positive photoresist compositions of the present invention may further comprise any of compatible additives such as surfactants for prevention of striation within ranges not adversely affecting the objects of the invention. Such surfactants include, but are not limited to, Fluorad FC-430 and FC-431 (trade names, available from Fluorochemical-Sumitomo 3M Co.), EFTOP EF122A, EF122B, EF122C and EF126 (trade names, available from Tohkem Products Corporation) and other fluorine-containing surfactants.

The positive photoresist compositions of the present invention are preferably used as a solution prepared by dissolving each of the ingredients (A), (B) and (C), and other additional ingredients added according to necessity in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, and monomethyl ethers, monoethyl ethers, monopropyl ethers, monobutyl ethers and monophenyl ethers thereof, and other polyhydric alcohols and derivatives thereof; dioxane and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. Of these solvents, preferred are acetone, methyl ethyl ketone, cyclohexanone, methyl isoamyl ketone, 2-heptanone, and other ketones; and ethyl lactate, methyl acetate, ethyl acetate, butyl acetate, methyl pyruvate, ethyl pyruvate, methyl methoxypropionate, ethyl ethoxypropionate, and other esters.

Practically, the positive photoresist compositions of the present invention may preferably be used, for example, in the following manner. Each of the ingredients (A), (B) and (C) and other ingredients added according to necessity is dissolved in an appropriate solvent as mentioned above to yield a coating solution; the coating solution is then applied, using a spinner or the like, onto a substrate such as a silicon wafer, and is then dried to form a resist film (photosensitive layer) about 0.1 to 0.5 $\mu$m thick; next, the resist film is selectively exposed to light through a desired mask pattern using a light source emitting light with a wavelength of approximately 365 nm, such as a low-pressure mercury lamp, high-pressure mercury lamp, and ultrahigh-pressure mercury lamp; the exposed resist film is subjected to post-exposure baking (PEB) at about 100° C. to about 120° C.; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern. The resist film is then subjected to post-baking at about 90° C. to about 110° C. and thereby yields a patterned resist thin film for use in an inclined implantation process.

The patterned resist thin film invites less scum, is excellent in thermal resistance and has a good shape even when it is very thin of about 0.1 to 0.5 µm. Accordingly, the patterned resist thin film can be advantageously used as a patterned resist mask in ion implantation processes such as an inclined implantation process.

EXAMPLES

The present invention will be illustrated in further detail with reference to several examples and comparative examples below, which are not intended to limit the scope of the invention.

The physical properties of the resulting positive photoresist compositions were determined by the following methods.

(1) Sensitivity

A sample was applied onto a silicon wafer using a spinner and was dried on a hot plate at 90° C. for 90 seconds to form a resist film 0.32 µm thick; the resist film was then irradiated with light for an increasing period from 0.1 second at intervals of 0.01 second using a reducing-type projection aligner NSR-2005i10D (available from Nikon Corporation, Japan; NA=0.57). The film was then post-exposure baked (PEB) at 110° C. for 90 seconds; was subjected to development in a 2.38% by weight tetramethylammonium hydroxide (TMAH) aqueous solution at 23° C. for 60 seconds, was rinsed with water for 30 seconds, and was dried. In this procedure, the sensitivity was defined as the exposure time period (Eth) in milliseconds (ms) at the time when the thickness of exposed portions became zero.

(2) Definition

The definition was defined as the critical definition at an exposure to reproduce a 0.5-µm mask pattern with a line-and-space (L&S) width of 1:1.

(3) Profile

A 0.5-µm wide resist pattern was subjected to scanning electron micrographic (SEM) observation on profile (sectional shape). The profile was rated based on the SEM observation according to the following criteria:

Excellent: Rectangular profile

Good: Almost rectangular profile with some T-top shape or intrusion at the interface of the substrate Poor: No isolated pattern obtained (4) Scum Formation A sample was applied onto a silicon wafer using a spinner and was dried on a hot plate at 90° C. for 90 seconds to form a resist film 0.32 µm thick. The resist film was then irradiated with light at an exposure of Eop (the exposure time period to reproduce a 0.35-µm pattern with line-and-space (L&S) of 1:1) as a standard exposure using a reducing-type projection aligner NSR-2005i10D (available from Nikon Corporation, Japan; NA=0.57). The resist film was then post-exposure baked (PEB) at 110° C. for 90 seconds, was subjected to development in a 2.38% by weight TMAH aqueous solution at 23° C. for 60 seconds, was rinsed with water for 30 seconds, and was dried. The resist film was then post-based at 100° C. for 60 seconds and thereby yielded a patterned resist. The whole surface of the substrate having the patterned resist was subjected to an SEM observation. Based on the SEM observation, the scum formation was rated according to the following criteria:

Good: Little scum observed

Poor: A large amount of scum observed (5-1) Stability of Latent Image Before Development: Post-Coating Delay PCD A sample was applied onto a silicon wafer using a spinner and was dried on a hot plate at 90° C. for 90 seconds to form a resist film 0.32 µm thick. The resist film was stored for 8 hours in a room under regular conditions for use of i-line resist without deamination by means of chemical filter. The resist film was then irradiated with light for an increasing period from 0.1 second at intervals of 0.01 second using a reducing-type projection aligner NSR-2005i10D (available from Nikon Corporation, Japan; NA=0.57). The film was then post-exposure baked (PEB) at 110° C. for 90 sec.; was subjected to development in a 2.38% by weight TMAH aqueous solution at 23° C. for 60 seconds, was rinsed with water for 30 seconds, and was dried. In this procedure, the exposure time period (Eth1) at which the thickness of exposed portions became zero was determined, and the post-coating delay (PCD) was determined by calculation according to the following equation:

$$PCD=(|Eth1-Eth|/Eth)\times 100 (\%)$$

The lower PCD is, the higher the stability of latent image before development is.

(5-2) Stability of Latent Image Before Development: Post-Exposure Delay PED

A sample was applied onto a silicon wafer using a spinner and was dried on a hot plate at 90° C. for 90 seconds to form a resist film 0.32 µm thick. The resist film was then irradiated with light for an increasing period from 0.1 second at intervals of 0.01 second using a reducing-type projection aligner NSR-2005i10D (available from Nikon Corporation, Japan; NA=0.57). The exposed resist film was stored for 8 hours in a room under regular conditions for use of i-line resist without deamination by means of chemical filter. The film was post-exposure baked (PEB) at 110° C. for 90 seconds, was subjected to development in a 2.38% by weight TMAH aqueous solution at 23° C. for 60 seconds, was rinsed with water for 30 seconds, and was dried. In this procedure, the exposure time period (Eth2) at which the thickness of exposed portions became zero was determined, and the post-exposure delay (PED) was determined by calculation according to the following equation:

$$PED=(|Eth2-Eth|/Eth)\times 100 (\%)$$

The lower PED is, the higher the stability of latent image before development is.

Preparation Example 1

Preparation of Novolak Resin A1

A total of 108 g (1 mol) of m-cresol, 1 g (0.005 mol) of p-toluenesulfonic acid hydrate, and 162 g of γ-butyrolactone were placed in a 1-liter separable four-neck flask, and the flask was equipped with a dropping funnel, a condenser tube, a thermometer and a mechanical stirrer. The mixture was stirred, and the flask was heated in an oil bath stirred with a magnetic stirrer. When the temperature of the reaction system reached 100° C., 64.8 g (0.8 mol) of 37% by weight formaldehyde aqueous solution was gradually added dropwise from the dropping funnel to the reaction system over 20 minutes. After the completion of addition, the reaction system was allowed to react for 4 hours while maintaining its temperature at 100° C. After the completion of reaction, the reaction system was cooled to room temperature and was neutralized with 0.6 g (0.006 mol) of triethylamine. The resulting mixture was diluted with 400 g of 2-heptanone, was placed in a 3-liter separatory funnel, was washed with three portions of 1 liter of pure water; the organic layer was extracted, was concentrated using an evaporator and thereby yielded a solution of a novolak resin (unprotected novolak resin). The obtained unprotected novolak resin had a weight average molecular weight Mw of 2600, a molecular weight distribution Mw/Mn of 3.96 and a dissolution time Dt(2.38) of 4.0 seconds.

The dissolution time Dt(2.38) was determined in the following manner. The novolak resin solution was applied to a substrate, was dried at 110° C. for 90 seconds and thereby yielded a resist film 1 μm thick. The resist film was then dissolved in 2.38% by weight TMAH aqueous solution at 23° C. In this procedure, the dissolution time Dt(2.38) was defined as the time for the resist film to completely dissolve in the TMAH aqueous solution.

The above-prepared unprotected novolak resin solution (solid content: 120 g, equivalent to 1 mole hydroxyl group) was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature; was treated with 36.0 g (0.5 mol) of 1-ethoxyethene, corresponding to 50% of mole equivalent of hydroxyl groups in the unprotected novolak resin, and with 0.024 g (0.125 mmol) of p-toluenesulfonic acid at room temperature for 1 hour with stirring. The mixture was then neutralized with 0.025 g (0.25 mmol) of triethylamine, was treated with an ion exchange resin, was concentrated using an evaporator and thereby yielded a solution of a novolak resin A1 having a 1-ethoxyethyl group substituting for 50% by mole of hydrogen atoms of phenolic hydroxyl groups. The novolak resin A1 had a dissolution time Dt(5.0) of more than 300 seconds.

The dissolution time Dt(5.0) was determined in the following manner. The novolak resin solution was applied to a substrate, was dried at 110° C. for 90 seconds and thereby yielded a resist film 1 μm thick. The resist film was then dissolved in 5.0% by weight TMAH aqueous solution at 23° C. In this procedure, the dissolution time Dt(5.0) was defined as the time for the resist film to completely dissolve in the TMAH aqueous solution.

Preparation Example 2
Preparation of Novolak Resin A2

A total of 86.4 g (0.8 mol) of m-cresol, 24.4 g (0.2 mol) of 3,4-xylenol, 1 g (0.005 mol) of p-toluenesulfonic acid hydrate, and 162 g of γ-butyrolactone were placed in a 1-liter separable four-neck flask, and the flask was equipped with a dropping funnel, a condenser tube, a thermometer and a mechanical stirrer. The mixture was stirred, and the flask was heated in an oil bath stirred with a magnetic stirrer. When the temperature of the reaction system reached 100° C., 66.9 g (0.83 mol) of 37% by weight formaldehyde aqueous solution was gradually added dropwise from the dropping funnel to the reaction system over 20 minutes. After the completion of addition, the reaction system was allowed to react for 4 hours while maintaining its temperature at 100° C. After the completion of reaction, the reaction system was cooled to room temperature and was neutralized with 0.6 g (0.006 mol) of triethylamine. The resulting mixture was diluted with 400 g of 2-heptanone, was placed in a 3-liter separatory funnel, was washed with three portions of 1 liter of pure water; the organic layer was extracted, was concentrated using an evaporator and thereby yielded a solution of an unprotected novolak resin. The obtained unprotected novolak resin had a weight average molecular weight Mw of 2900, a molecular weight distribution Mw/Mn of 3.89 and a dissolution time Dt(2.38) of 3.0 seconds.

The above-prepared unprotected novolak resin solution (solid content: 120 g, equivalent to 1 mole hydroxyl group) was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature; was treated with 36.0 g (0.5 mol) of 1-ethoxyethene, corresponding to 50% of mole equivalent of hydroxyl groups in the novolak resin, and with 0.024 g (0.125 mmol) of p-toluenesulfonic acid at room temperature for 1 hour with stirring. The mixture was then neutralized with 0.025 g (0.25 mmol) of triethylamine, was treated with an ion exchange resin, was concentrated using an evaporator and thereby yielded a solution of a novolak resin A2 having a 1-ethoxyethyl group substituting for 50% by mole of hydrogen atoms of phenolic hydroxyl groups. The novolak resin A2 had a dissolution time Dt(5.0) of more than 300 seconds.

Preparation Example 3
Preparation of Novolak Resin A3

The unprotected novolak resin solution (solid content: 120 g, equivalent to 1 mole hydroxyl group) prepared in Preparation Example 1 was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature; was treated with 50.4 g (0.7 mol) of 1-ethoxyethene, corresponding to 70% of mole equivalent of hydroxyl groups in the novolak resin, and with 0.033 g (0.17 mmol) of p-toluenesulfonic acid at room temperature for 1 hour with stirring. The mixture was then neutralized with 0.035 g (0.35 mmol) of triethylamine, was treated with an ion exchange resin, was concentrated using an evaporator and thereby yielded a solution of a novolak resin A3 having 1-ethoxyethyl groups substituting for 70% by mole of hydrogen atoms of phenolic hydroxyl groups. The novolak resin A3 had a dissolution time Dt(5.0) of more than 300 seconds.

Comparative Preparation Example 1
Preparation of Novolak Resin A4

The unprotected novolak resin solution (solid content: 120 g, equivalent to 1 mole hydroxyl group) prepared in Preparation Example 1 was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature; was treated with 109 g (0.5 mol) of di-tert-butyl dicarbonate, corresponding to 50% of mole equivalent of hydroxyl groups in the unprotected novolak resin, and with 68.2 g (0.675 mmol) of triethylamine at 40° C. for 1 hour with stirring. The mixture was then neutralized with 6 liters of acetic acid aqueous solution containing 50 g (0.83 mol) of acetic acid in pure water, and the precipitated resin was separated by filtration.

The resin was dissolved in dioxane, was subjected to treatment with an ion exchange resin, was concentrated using an evaporator and thereby yielded a solution of a novolak resin A4 having a tert-butoxycarbonyl group substituting for 50% by mole of hydrogen atoms of phenolic hydroxyl groups. The novolak resin A4 had a dissolution time Dt(5.0) of more than 300 seconds.

Comparative Preparation Example 2
Preparation of Novolak Resin A5

A total of 108 g (1 mol) of o-cresol, 1 g (0.005 mol) of p-toluenesulfonic acid hydrate, and 162 g of γ-butyrolactone were placed in a 1-liter separable four-neck flask, and the flask was equipped with a dropping funnel, a condenser tube, a thermometer and a mechanical stirrer. The mixture was stirred, and the flask was heated in an oil bath stirred with a magnetic stirrer. When the temperature of the reaction system reached 100° C., 81.1 g (1.0 mol) of 37% by weight formaldehyde aqueous solution was gradually added dropwise from the dropping funnel to the reaction system over 20 minutes. After the completion of addition, the reaction system was allowed to react for 8 hours while maintaining its temperature at 100° C. After the completion of reaction, the reaction system was cooled to room temperature and was neutralized with 0.6 g (0.006 mol) of triethylamine. The resulting mixture was diluted with 400 g of 2-heptanone, was placed in a 3-liter separatory funnel, was washed with three portions of 1 liter of pure water; the organic layer was extracted, was concentrated using an evaporator and thereby yielded a solution of a novolak resin (unprotected novolak resin). The obtained unprotected novolak resin had a weight average molecular weight Mw of 2600, a molecular weight distribution Mw/Mn of 2.09 and a dissolution time Dt(2.38) of 3.0 seconds.

The above-prepared unprotected novolak resin solution (solid content: 120 g, equivalent to 1 mole hydroxyl group) was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature; was treated with 36.0 g (0.5 mol) of 1-ethoxyethene, corresponding to 50% of mole equivalent of hydroxyl groups in the novolak resin, and with 0.024 g (0.125 mmol) of p-toluenesulfonic acid at room temperature for 1 hour with stirring. The mixture was then neutralized with 0.025 g (0.25 mmol) of triethylamine, was treated with an ion exchange resin, was concentrated using an evaporator and thereby yielded a solution of a novolak resin A5 having 1-ethoxyethyl groups substituting for 50% by mole of hydrogen atoms of phenolic hydroxyl groups. The novolak resin A5 had a dissolution time Dt(5.0) of more than 300 seconds.

Comparative Preparation Example 3
Preparation of Novolak Resin A6

A total of 75.6 g (0.7 mol) of o-cresol, 32.4 g (0.3 mol) of p-cresol, 1 g (0.005 mol) of p-toluenesulfonic acid hydrate, and 162 g of γ-butyrolactone were placed in a 1-liter separable four-neck flask, and the flask was equipped with a dropping funnel, a condenser tube, a thermometer and a mechanical stirrer. The mixture was stirred, and the flask was heated in an oil bath stirred with a magnetic stirrer. When the temperature of the reaction system reached 100° C., 101.4 g (1.25 mol) of 37% by weight formaldehyde aqueous solution was gradually added dropwise from the dropping funnel to the reaction system over 20 minutes. After the completion of addition, the reaction system was allowed to react for 16 hours while maintaining its temperature at 100° C. After the completion of reaction, the reaction system was cooled to room temperature and was neutralized with 0.6 g (0.006 mol) of triethylamine. The resulting mixture was diluted with 400 g of 2-heptanone, was placed in a 3-liter separatory funnel, was washed with three portions of 1 liter of pure water; the organic layer was extracted, was concentrated using an evaporator and thereby yielded a solution of an unprotected novolak resin. The obtained unprotected novolak resin had a weight average molecular weight Mw of 1900, a molecular weight distribution Mw/Mn of 2.5 and a dissolution time Dt(2.38) of 3.0 seconds.

The above-prepared unprotected novolak resin solution (solid content: 120 g, equivalent to 1 mole hydroxyl group) was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature; was treated with 36.0 g (0.5 mol) of 1-ethoxyethene, corresponding to 50% of mole equivalent of hydroxyl groups in the novolak resin, and with 0.024 g (0.125 mmol) of p-toluenesulfonic acid at room temperature for 1 hour with stirring. The mixture was then neutralized with 0.025 g (0.25 mmol) of triethylamine, was treated with an ion exchange resin, was concentrated using an evaporator and thereby yielded a solution of a novolak resin A6 having a 1-ethoxyethyl group substituting for 50% by mole of hydrogen atoms of phenolic hydroxyl groups. The novolak resin A6 had a dissolution time Dt(5.0) of more than 300 seconds.

Comparative Preparation Example 4
Preparation of Polyhydroxystyrene S1

A total of 120 g (1 mol) of 4-hydroxystyrene was added to tetrahydrofuran (THF) to a concentration of 20% by weight in a 1-liter three-neck flask equipped with a condenser tube; the mixture was stirred with a magnetic stirrer and thereby yielded a solution; the solution was subjected to radical polymerization at 75° C. under reflux using azobisisobutyronitrile (AIBN) as a polymerization initiator and thereby yielded a solution of a polyhydroxystyrene. The prepared polyhydroxystyrene had a weight average molecular weight Mw of 12700, a molecular weight distribution Mw/Mn of 2.7, and a dissolution time Dt(2.38) of 3.0 seconds.

The above-prepared polyhydroxystyrene solution (solid content: 120 g, equivalent to 1 mole hydroxyl group) was placed in a 1-liter egg plant type flask, was diluted with 1,4-dioxane to a concentration of 15% by weight, was treated with an ion exchange resin and was concentrated using an evaporator to a concentration of 20% by weight. The mixture was cooled to room temperature, was treated with 36.0 g (0.5 mol) of 1-ethoxyethene, corresponding to 50% of mole equivalent of hydroxyl groups in the polyhydroxystyrene, and with 0.024 g (0.125 mmol) of p-toluenesulfonic acid at room temperature for 1 hour with stirring. The mixture was then neutralized with 0.025 g (0.25 mmol) of triethylamine, was treated with an ion exchange resin, was concentrated using an evaporator and thereby yielded a solution of a polyhydroxystyrene S1 having 1-ethoxyethyl groups substituting for 50% by mole of hydrogen atoms of phenolic hydroxyl groups. The polyhydroxystyrene S1 had a dissolution time Dt(5.0) of 35 seconds.

Examples 1 to 3 and Comparative Examples 1 to 4

Ingredient (A): Novolak resins A1 to A6 and polyhydroxystyrene S1 prepared in Preparation Examples 1 to 3 and Comparative Preparation Examples 1 to 4

Ingredient (B): A quinonediazide ester prepared from 1 mole of a phenolic compound represented by the following formula and 2 moles of 1,2-naphthoquinonediazido-5-sulfonyl chloride

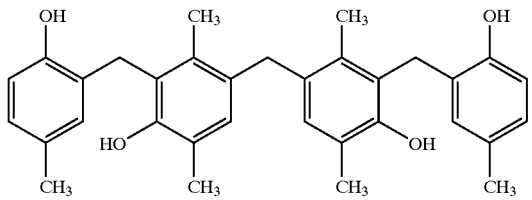

Ingredient (C): 1,1-Bis(4-hydroxyphenyl)cyclohexane
Ingredient (D): 2,2',4,4'-Tetrahydroxybenzophenone
Ingredient (E): Triethylamine
Ingredient (F): Salicylic acid In 1068 parts by weight of 2-heptanone were dissolved 100 parts by weight of the ingredient (A), 66.5 parts by weight of the ingredient (B), 33 parts by weight of the ingredient (C), 4 parts by weight of the ingredient (D), 0.6 part by weight of the ingredient (E), and 0.6 part by weight of the ingredient (F); the resulting solution was filtrated using a 0.2-μm membrane filter and thereby yielded a series of positive photoresist compositions.

The physical properties (1) through (5-2) of the prepared positive photoresist compositions were determined, and the results are shown in Table 1.

Example 4

A positive photoresist composition was prepared by the process of Example 1, except using, as the ingredient (B), a 2:1 by weight mixture of (b-1) a quinonediazide ester prepared from 1 mole of a phenolic compound represented by the following formula:

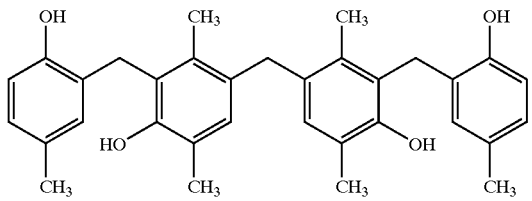

and 2 moles of 1,2-naphthoquinonediazido-5-sulfonyl chloride, and (b-2) a quinonediazide ester prepared from 1 mole of a phenolic compound represented by the following formula:

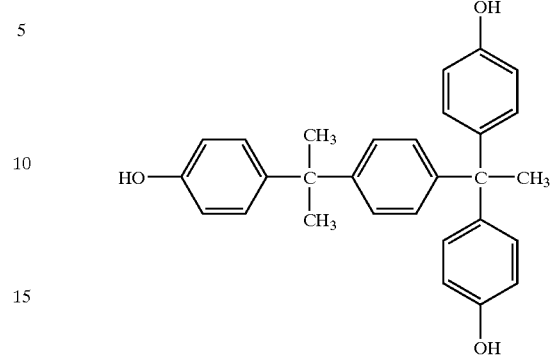

and 3 moles of 1,2-naphthoquinonediazido-5-sulfonyl chloride. The physical properties (1) through (5-2) of the prepared positive photoresist composition were determined, and the results are shown in Table 1.

Example 5

A positive photoresist composition was prepared by the procedure of Example 4, except using, as the ingredient (C), a 2:1 by weight mixture of 1,1-bis(4-hydroxyphenyl)cyclohexane and 2,6-bis(2,5-dimethyl-4-hydroxybenzyl)-4-methylphenol. The physical properties (1) through (5-2) of the prepared positive photoresist composition were determined, and the results are shown in Table 1.

Comparative Example 5

A positive photoresist composition was prepared by the procedure of Example 1, except that the ingredient (C) was not used. The physical properties (1) through (5-2) of the prepared positive photoresist composition were determined, and the results are shown in Table 1.

TABLE 1

| | Ingredient (A) | Sensitivity (ms) | Definition (μm) | Profile | Scum | Stability of latent image PCD | Stability of latent image PED |
|---|---|---|---|---|---|---|---|
| Ex. 1 | A1 | 150 | 0.28 | Good | Good | 0% | 0% |
| Ex. 2 | A2 | 200 | 0.28 | Good | Good | 0% | 0% |
| Ex. 3 | A3 | 120 | 0.30 | Good | Good | 0% | 0% |
| Ex. 4 | A1 | 180 | 0.28 | Excellent | Good | 0% | 0% |
| Ex. 5 | A1 | 180 | 0.28 | Excellent | Good | 0% | 0% |
| Com. Ex. 1 | A4 | — | not resolved | Poor | — | — | — |
| Com. Ex. 2 | A5 | 140 | 0.35 | Good | Poor | 0% | 0% |
| Com. Ex. 3 | A6 | 200 | 0.32 | Good | Poor | 0% | 0% |
| Com. Ex. 4 | S1 | 100 | 0.32 | Good | Good | 3% | 30% |
| Com. Ex. 5 | A1 | 500 | not resolved | Poor | Good | 0% | 0% |

While the present invention has been described with reference to what are presently considered to be the preferred embodiments, it is to be understood that the invention is not limited to the disclosed embodiments. On the contrary, the invention is intended to cover various modifications and equivalent arrangements included within the sprit and scope of the appended claims. The scope of the following claims is to be accorded the broadest interpretation so as to encompass all such modifications and equivalent structures and functions.

What is claimed is:

1. A positive photoresist composition consisting essentially of:

(A) a novolak resin containing equal to or more than 20% by mole of a m-cresol constitutional repeating unit in total phenolic constitutional repeating units and having 1-ethoxyethyl groups substituting for part of hydrogen atoms of phenolic hydroxyl groups;

(B) a quinonediazide ester represented by following Formula (I):

Formula (I):

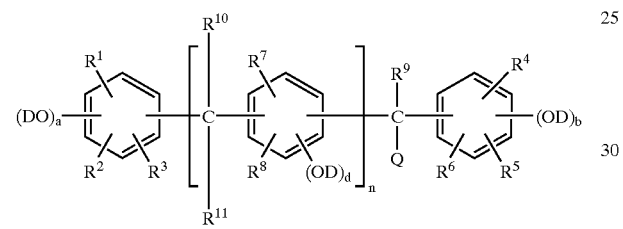

(I)

wherein each of $R^1$, $R^2$, $R^3$, $R^4$, $R^5$, $R^6$, $R^7$, and $R^8$ is independently a hydrogen atom, a halogen atom, an alkyl group containing 1 to 6 carbon atoms, an alkoxy group containing 1 to 6 carbon atoms, or a cycloalkyl group;

each of $R^9$, $R^{10}$, and $R^{11}$ is independently a hydrogen atom or an alkyl group containing 1 to 6 carbon atoms;

Q is a hydrogen atom or an alkyl group containing 1 to 6 carbon atoms, or Q is combined with $R^9$ to form a cycloalkyl group containing 3 to 6 carbon members or a residue represented by following Formula (II):

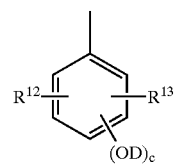

(II)

wherein each of $R^{12}$ and $R^{13}$ is independently a hydrogen atom, a halogen atom, an alkyl group containing 1 to 6 carbon atoms, an alkoxy group containing 1 to 6 carbon atoms, or a cycloalkyl group; and c is an integer of from 1 to 3;

each of Ds is independently a hydrogen atom or a 1,2-naphthoquinonediazido-5-sulfonyl group, where at least one of Ds is a 1,2-naphthoquinonediazido-5-sulfonyl group;

each of a and b is independently an integer of from 1 to 3;

d is an integer of from 0 to 3; and n is an integer of from 0 to 3; and (C) a phenolic compound represented by following Formula (III):

Formula (III):

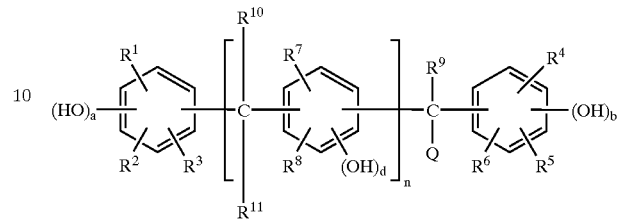

(III)

wherein each of $R^1$, $R^2$, $R^3$, $R^4$, $R^5$, $R^6$, $R^7$, and $R^8$ is independently a hydrogen atom, a halogen atom, an alkyl group containing 1 to 6 carbon atoms, an alkoxy group containing 1 to 6 carbon atoms, or a cycloalkyl group;

each of $R^9$, $R^{10}$, and $R^{11}$ is independently a hydrogen atom or an alkyl group containing 1 to 6 carbon atoms;

Q is a hydrogen atom or an alkyl group containing 1 to 6 carbon atoms, or Q is combined with $R^9$ to form a cycloalkyl group containing 3 to 6 carbon members or a residue represented by following Formula (IV):

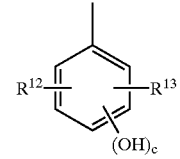

(IV)

wherein each of $R^{12}$ and $R^{13}$ is independently a hydrogen atom, a halogen atom, an alkyl group containing 1 to 6 carbon atoms, an alkoxy group containing 1 to 6 carbon atoms, or a cycloalkyl group; and c is an integer of from 1 to 3;

each of a and b is independently an integer of from 1 to 3;

d is an integer of from 0 to 3; and n is an integer of from 0 to 3.

2. The positive photoresist composition according to claim 1, further consisting essentially of (D) at least one compound capable of absorbing light with a wavelength of approximately 365 nm.

3. The positive photoresist composition according to claim 1, further consisting essentially of (E) at least one amine.

4. The positive photoresist composition according to claim 1, further consisting essentially of (F) at least one organic carboxylic acid.

5. The positive photoresist composition according to claim 1, wherein the 1-ethoxyethyl group substitutes for 30% to 70% by mole of hydrogen atoms of phenolic hydroxyl groups of the novolak resin (A).

6. The positive photoresist composition according to claim 1, wherein a resist film prepared from the positive photoresist composition has a B parameter of from 0.2 to 1.0.

7. A method of patterning a resist thin film for use in an inclined implantation process, the method comprising the steps of:
(1) applying a solution of the positive photoresist composition of claim 1 to a substrate and drying the applied solution to thereby form a resist film having a thickness of from 0.1 to 0.5 µm;
(2) selectively exposing the resist film to light through a mask;
(3) subjecting the exposed resist film to post-exposure baking;
(4) developing the resulting resist film with an aqueous alkaline solution to thereby dissolve and remove exposed portions of the resist film; and
(5) post-baking the resulting film.

* * * * *